United States Patent [19]

Plyshevsky et al.

[11] 3,990,390
[45] Nov. 9, 1976

[54] APPARATUS FOR VACUUM COATING OF A SUBSTRATE

[76] Inventors: Anatoly Iosifovich Plyshevsky, ulitsa Dudykina, 9a, kv. 2; Evgeny Pavlovich Ponomarenko, ulitsa Dunaiskaya, 35, kv. 89; Jury Kuzmich Belov, ulitsa Gogolya, 161b, kv. 77; Boris Vasilievich Dementiev, prospekt Lenina, 145, kv. 29, all of Zaporozhie; Vsemir Vasilievich Romanov, ulitsa Verkhnaya Maslovka, 7, kv. 30, Moscow; Alexei Konstantinovich Petrov, ulitsa Verkhnaya, 9/26, kv. 7, Zaporozhie; Leonty Naumovich Soroko, prospekt Lenina, 151, kv. 102; Svetlana Yakovlevna Panfilova, ulitsa Patrioticheskaya, 70, kv. 72, both of Zaporozhie, all of U.S.S.R.

[22] Filed: Jan. 27, 1975

[21] Appl. No.: 544,663

[52] U.S. Cl. ................................. 118/49; 118/235; 118/325

[51] Int. Cl.² .................................. C23C 13/10
[58] Field of Search .................... 118/48–49.5, 118/325, 235; 427/50, 52, 78, 91, 99, 109, 124, 248–251

[56] References Cited
UNITED STATES PATENTS 3,931,789  1/1976  Kakei et al. .......................... 118/49

Primary Examiner—Morris Kaplan
Attorney, Agent, or Firm—Haseltine, Lake & Waters

[57] ABSTRACT

Substrate supply and windup rolls are arranged in a housing arranged at each end of a vacuum coating chamber. Gate means provide for optionally sealing of one housing for loading and unloading purposes while simultaneously coating a continuous strip related to the supply and windup rolls of the second housing. Carriage means carry tension rolls at the extreme ends thereof and reciprocate across the coating chamber in operative association with said housings at the extremes of the reciprocating movement whereby to effect the coating and loading or unloading operations.

4 Claims, 5 Drawing Figures

APPARATUS FOR VACUUM COATING OF A SUBSTRATE

The present invention relates to apparatuses for applying coatings in vacuum on a metal band or other materials rolled in coils, e.g., a wire mesh, a perforated strip or foil.

The invention can be used most effectively for applying onto the metal band readily evaporated metals, for example, chrome, aluminium, nickel, copper, titanium, etc.

Recently there has been achieved a significant success in the application of coatings and metallurgical semi-finished products (plates, strips, rolled shapes, etc.). Various metal coatings are applied such as tin, zinc, lead and — to a lesser extent — aluminium, nickel, chrome and titanium.

The increased interest in coated products is explained by the following reasons. Coatings ensure a longer service life of the products and, therefore, reduce the metal consumption for the same amount of products.

The application of coatings on steels and alloys, very ordinary by their chemical composition, makes it possible to impart to them quite novel mechanical and technological properties with regard to wear resistance, heat resistance and resistance to electrochemical corrosion.

In addition, the use of coated low-alloy steels instead of special steels and alloys enables the serving of critical and expensive additions which are composition elements of these steels.

Among the known methods of metal-coating application the vacuum method has been substantially developed, as being sufficiently productive and relatively easily performed, with several metals being used in modern vacuum technology. The vacuum technology has unquestionable advantages over other technologies because it allows obtaining coatings free from gases, non-metallic inclusions and other detrimental impurities in the conditions of production which excludes the emission of toxic and harmful substances.

Thus, electro-ray evaporation in vacuum enables the production of aluminium-coated strips with a 0.05 to 2 microns protective coating at the rate of application up to 30 m/sec.

The expansion of vacuum coating technology is, however, restrained by the lack of reliable and efficient apparatuses to accomplish the process.

Known in the art is an apparatus for vacuum coating of coil materials (see USSR Author's certificate No. 291997) which comprises a vacuum metallization chamber and a device arranged therein for moving a band over an evaporator, a chamber for a rewinding mechanisms and a gate arranged at the point of feeding-in and pulling the band out of the vacuum chamber.

The apparatus is intended for the metallization of coil materials. It is simple in design but is of low efficiency because it has to be stopped for replacing the coils. Besides, the evaporation zone of the apparatus is inadequate.

Known in the art are continuously operating apparatuses with gates arranged at the points of feeding in and pulling a band out of a vacuum metallization chamber. They are mainly employed for thin bands. The gates in this apparatus quickly wear out and require the use of high-duty vacuum pumps, with capacities three to five times higher than those of pumps used to evacuate the metallization chamber.

All known apparatuses allow the obtaining of thin-film condensate coatings with thicknesses up to 10 microns by the process of evaporating a metallizing agent which is in liquid state. For industrial purposes, however, thicker coatings are often needed. For example, the automobile, tractor, chemical and some other industries require a steel strip (sheet) with a protective chrome or aluminium coating of from 20 to 50 and more microns thick. The material which can operate at increased temperatures and in active chemical media was obtained till recently in small quantities by plating, melt dipping or by a gas noncontact method (with the use of halides).

The main object of the present invention is to provide an apparatus for vacuum coating of a substrate, e.g. a metal band, which has a higher efficiency as a result of cutting the time periods between the band-replacing operations.

Another, no less important, object of the invention is the possibility of applying a thicker coating film on the metal band to be treated with the use of a liquid, as well as a solid metallizing agent.

Still another object of the invention is to extend the productive operating time of the apparatus, as a result of a continuous operation of the evaporator, which is achieved by the continuous alternate feeding of the metallizing agent from the charging facilities into the evaporator crucible.

These and other objects are achieved through the creation of an apparatus for vacuum coating of a metal band, comprising a metallization chamber with an evaporator, heating elements and a mechanism for feeding the metal band into the chamber, which are arranged therein, a rewinding chamber arranged at one end of the metallization chamber. The, mechanism for feeding the band, according to the invention, represents two tension rollers mounted on at least one carriage which is installed in guides arranged along the metallization chamber, and arresters are provided to stop the carriage in end positions in which one of its tension rollers is in the rewinding chamber and the other tension roller of the carriage is at the remotest distance from the other rewinding chamber, arranged at the other end of the metallization chamber. At least one vacuum lock is provided which seals off the metallization chamber alternately from the rewinding chambers when band coils are being replaced in them.

The provision in the apparatus of the second rewinding chamber and the mechanism for feeding the band into the metallization chamber makes it possible to accomplish a continuous metallization of the bands which are fed from both rewinding chambers alternately. This is also promoted by the vacuum lock which makes it possible to seal off the metallization chamber from the rewinding chamber wherein the band coil is being replaced and to carry on the operation with the other rewinding chamber.

The tension rollers of the mechanism for feeding the band into the metallization chamber can be secured at the ends of the carriage, and the vacuum lock can be provided in a central portion of the carriage which has on both its ends air-tight seals; the arresters of the carriage's end positions can be arranged in the rewinding chambers.

In this case the metallization chamber can be sufficiently sealed off by one lock mounted on the carriage, as one of the tension rollers is in the metallization chamber during its operation and the other is in the rewinding chamber in which the band coil can be replaced at this time.

The lock comprising the air-tight seal on its both ends is moved with the carriage alternately to one rewinding chamber or the other, and seals off the metallization chamber from one rewinding chamber, while the band is fed into it from the other rewinding chamber.

The tension rollers of the mechanism for feeding the band into the metallization chamber can be mounted by one on each of the carriages; these carriages can be linked by an articulation means for simultaneously moving them from one end position to the other after the treatment of the band coil is over; the vacuum locks can be arranged at the ends of the metallization chamber, and the arresters of the carriages' end positions in the butt ends of the metallization chamber.

In this exemplary embodiment of the apparatus one of the carriages is uncoupled in the process of operation and is in the rewinding chamber wherein the band coil is being replaced and which is sealed off by one of the locks from the metallization chamber. The other carriage is in the metallization chamber, at this time the second lock is opened and communicates the latter chamber with the second rewinding chamber from which the band is being fed for treatment. Such an embodiment of the apparatus also ensures continuous operation.

The carriage of the mechanism for feeding the band into the metallization chamber can be provided with an independent drive of a reciprocating movement.

The provision of the drive for the carriage of the mechanism for feeding the band into the metallization chamber makes it easier to feed the band into the metallization chamber and prevents the band from rupture or deformation.

It is desirable to provide the metallization chamber of the apparatus with two facilities for charging a metallizing agent into the evaporator crucible and to place them at both sides of the evaporation zone of the metallizing agent at a distance not exceeding the length of the crucible which can be mounted on a bogie to be positioned so that it can perform reciprocating movements alternately to each of the charging facilities in additional guides which can be arranged along the metallization chamber.

The apparatus with the crucible performing the reciprocating movement makes it possible to add the metallizating agent into the crucible from the charging facilities outside an evaporation zone and to avoid a sharp increase in the quantity of emitted gases, which takes place when fresh portions of the metallizing agent are added into the hot zone. The proposed apparatus enables a continuous and uniform evaporation of the metallizing agent.

Fresh portions of the metallizing agent are added alternately from the two charging facilities arranged at both sides of the evaporation zone. The evaporator can operate when it is charged with the metallizing agent both in a solid or in a liquid state.

The invention will further be explained by particular embodiments thereof for vacuum coating of a metal band, with reference to the accompanying figures, in which.

Figure 1:
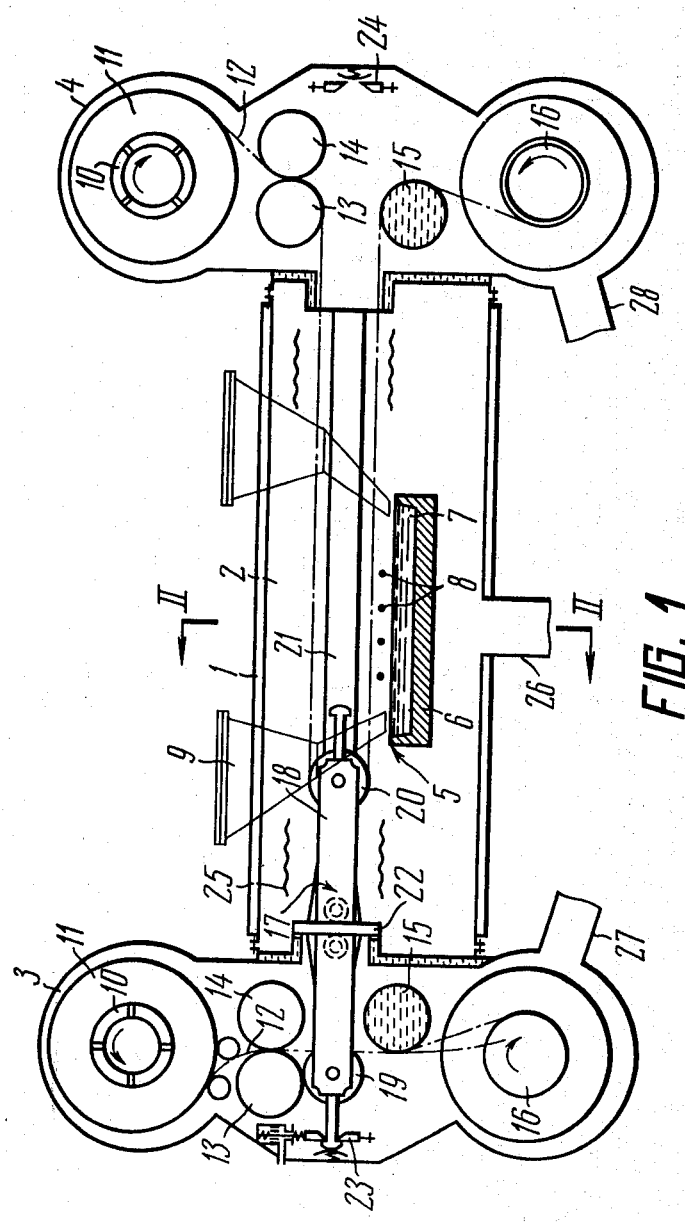
FIG. 1 shows a first exemplary apparatus according to the invention with a mechanism for feeding the band into a metallization chamber, comprising one carriage with two tension rollers and a vacuum lock arranged between them, in a longitudinal section.

The inventive apparatus for vacuum coating of a metal band comprises a casing 1 (FIGS. 1 and 2) confining a metallization chamber 2 and two rewinding chambers 3 and 4 (FIG. 1) arranged at its ends. Inside the metallization chamber 2 there is provided an evaporator 5 which comprises a crucible 6 for a metallizing agent 7, e.g., ferrochrome. The crucible 6 is superimposed by heaters 8. Two charging facilities 9 are provided to charge the metallizing agent 7 into the crucible 6.

Each of the rewinding chambers 3 and 4 has a rewinding mechanism comprising a drum 10 to put thereon tightly a coil 11 of a band 12 to be treated, with guide rollers 13, 14 and 15, and a drum 16 to wind the treated band 12 thereon.

A mechanism 17 for feeding the band into the metallization chamber 2 has a carriage 18 with two tension rollers 19 and 20 arranged at its ends; the carriage 18 is positioned so that it can move in guides 21 arranged along the metallization chamber 2. In the central portion of the carriage 18, between the tension rollers 19 and 20, there is povided a vacuum lock 22 which has straight seals at both sides for sealing off the metallization chamber 2 alternately from the rewinding chambers 3 and 4 when the coils 11 of the bands 12 are being replaced therein.

To secure the carriage 18 in end positions, arresters 23 and 24 are provided in the rewinding chambers 3 and 4. At this time one of the tension rollers 19 of the carriage 18 is in the rewinding chamber 3, and the other tension roller 20 is in a remotest position from the rewinding chamber 4. In the metallization chamber 2 there are heating elements 25 intended for heating the band 12 when it is fed in and pulled out from the metallization chamber 2.

The metallization chamber 2 comprises a pipe branch 26 to connect it with a vacuum system (not shown in the drawing). The rewinding chambers 3 and 4 also have conduit branches 27, 28 to communicate them with the vacuum system.

The rollers 15 in the rewinding chambers 3 and 4 can be water-cooled. The casing 1 of the metallization chamber 2 has double water-cooled walls.

In another embodiment of the present invention a mechanism 57 (FIGS. 3 and 4) for feeding the band 12 (FIG. 3) into a metallization chamber 42 can have two carriages, 58, 58' coupled with each other by an articulation means 31. Tension rollers 59, 60 are secured by respective ones of the carriages 58, 58'. Two throughway vacuum locks 32, 33 are arranged between the metallization chamber 42 and either rewinding chamber 43, 44. The carriages 58, 58' of the feeding mechanism 57 comprises pushers 34 and 35. The carrriages 58, 58' can have independent drives 36 (FIG. 4) for a reciprocating movement.

Figure 2:
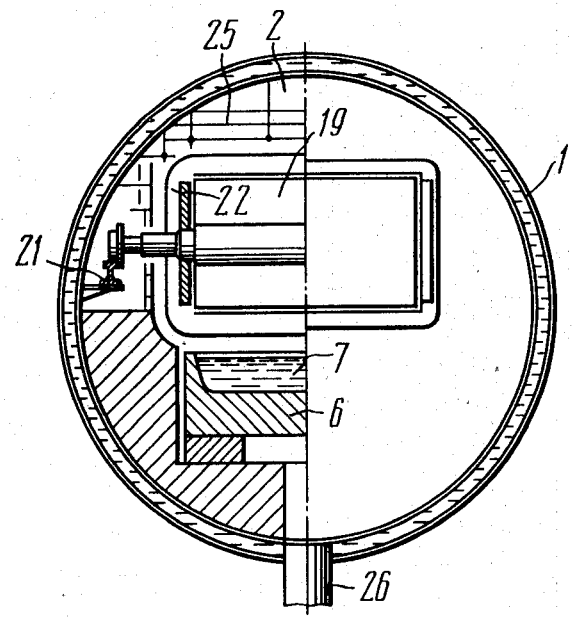
FIG. 2 is a partial transverse section along line II — II in FIG. 1.
Figure 4:
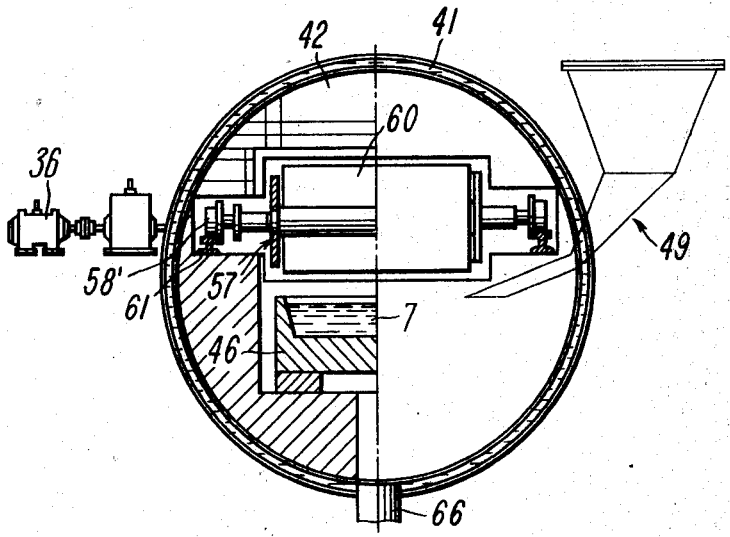
FIG. 4 is a partial transverse section along line IV — IV in FIG. 3.
Figure 3:
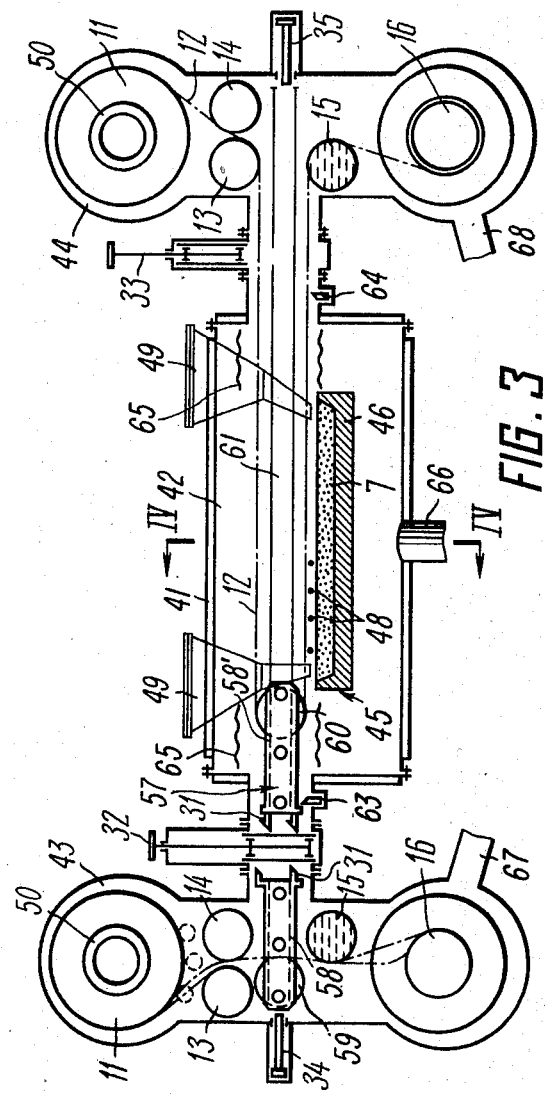
FIG. 3 shows the apparatus according to the invention with the mechanism for feeding the band into the metallization chamber, comprising two carriages with two tension rollers and two vacuum locks, in a longitudinal section.
Figure 5:
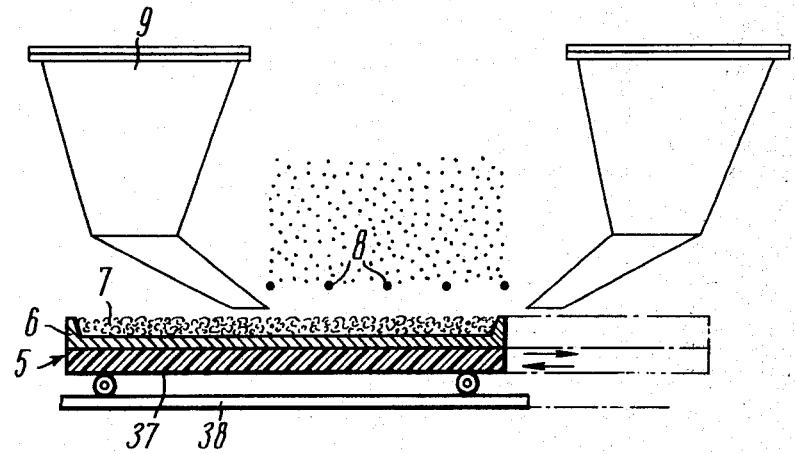
FIG. 5 shows an evapoarator, the crucible of which is mounted on a bogie, and two charging facilities (schematic diagram).

It will be understood that those parts that are common between the two embodiments of the invention have been identified by identical numerals (such as the elements 13 through 16), and of course the treated coil 11 of the band 12 and the metallizing agent 7 are substantially the same. The early-described elements 1, 5, 6, 8 through 10, 21 and 23 through 28 of the frst embodiment (FIGS. 1 and 2) have their equivalent counterparts in the elements 41, 45, 46, 48 through 50, 61 and 63 through 68, respectively, in the second embodiment (FIGS. 3 and 4). FIG. 5 can relate to either of the two embodiments.

In either embodiment of the invention the respective crucible 6, 46 in the evaporator 5, 45 can be mounted on a bogie 37 (FIG. 5) reciprocatingly movable in guides 38 along the metallization chamber 2, 42 alternately to each of the charging facilities 9, 49 arranged at both sides of the evaporation zone of the metallizing agent 7 at a distance not exceeding the length of the crucible 6, 46.

The inventive apparatus of FIG. 1 functions as follows. The band coils to be treated are mounted in a similar way in the rewinding chambers 3, 4. For this the coil 11 of the band 12 is put on the drum 10 in the rewinding chamber 3, and the free end of the band 12 is secured on the drum 16 for the treated band. At this time the carriage 18 with the tension roller 19 is in the same end positon (at the side of the rewinding chamber 3) and is fixed by the arrester 23. After the band 12 is inserted, the carriage 18 is moved with the help of a band loop guiding the tension roller 20 to the other end position, in the direction of the rewinding chamber 4, and is fixed by the arrester 24.

When the carriage 18 is moving it feeds the band 12 into the metallization chamber 2 with the help of the tension roller 19. In the latter chamber vacuum is created and the metallizing agent heated, as a result of which a coating is applied on the band 12; then the band 12 is rewound from the drum 10 on the drum 16. The rewinding chambers 3 and 4 alternately cooperate with the metallization chamber 2.

FIG. 1 shows the position of the carriage 18 when coating is being applied on the band 12 fed from the rewinding chamber 4 wherein vacuum is created equal to that in the metallization chamber 2. At this moment the rewinding chamber 3 is sealed off from them by the vacuum lock 22, and communicates with the atmosphere at a time when, as described above, the coil 11 of the band 12 to be treated is being mounted in this chamber.

After the next coil 11 is mounted the rewinding chamber 3 is sealed off; vacuum is created in it equal to that in the metallization chamber 2. The band 12 is fed into the metallization chamber 2 by moving the carriage 18 to the end position in which it is fixed in the rewinding chamber 4. At this time the vacuum lock 22 communicates the rewinding chamber 3 with the metallization chamber 2 and seals off the rewinding chamber 4 from the metallization chamber 2. Subsequently, the band coil replacement operations are repeated and carried out without disturbing the vacuum in the metallization chamber 2 and with a continuous operation of the evaporator.

In case of using the apparatus having two carriages and two vacuum locks (FIG. 3), the functions are as follows. The coils 11 of the bands 12 to be treated are put on the drums 50 in the rewinding chambers 43, 44, wile the band ends are secured on the drums 46 for the treated band. Simultaneously the arrester 64 is countersunk, the carriages 58, 58' are coupled, and with the help of the band loop that surrounds the tension rollers 60 of the carriage 58', both carriages are moved in the guides 61 till they reach the respective pushers 34, 35 with a stop. At this time the band 12 is fed into the metallization chamber 42 from the rewinding chamber 43 by means of the roller 59.

When the carriages 58, 58' reach the pusher 35 they are uncoupled, and the carriage 58 with the band 12 is returned to the arrester The coating of the band 12 is carried out by drawing it over the evaporator 45 with the help of the rollers 13, 14 and 15 of the rewinding mechanism and the tension roller 59. The water-cooled roller 15 helps to quickly cool the band 12 treated The coating the metallization chamber 42.

To replace the band coil the rewinding chamber 44 is sealed off from the metallization chamber 42 by means of the vacuum lock 33. After replacement of the band coil and re-establishment of the required vacuum in the rewinding chamber 44 the vacuum lock 33 communicates the metallization chamber 42 with the rewinding chamber 44, and the carriage 58' is moved by the pusher 35 till it is coupled with the carriage 58. Subsequent operations are repeated without disturbing the vacuum in the metallization chamber 42 and with a continuous operation of the evaporator 45 and the entire apparatus.

To prevent rupture or deformation of the band 12 when its strength is low, in the process of replacing the coils 11, the coupled carriages 58, and 58' are provided with the drives 36 (FIG. 4) to enable the carriages to be moved reciprocatingly.

For the purpose of continuous and long operation of the apparatus for the vacuum coating of the metal band 12, either apparatus embodiment comprises the evaporator, namely 5, 45 (FIG. 5 showing the former) wherein the crucible 6 (46) for the metallizing agent 7 is mounted on the bogie 37. The heating of the metallizing agent 7 to a temperature under which it evaporates is carried out by the heaters 8 (48). The bogie 37 with the crucible (46) performs a slow reciprocating movement between the two charging facilities 9 (49) delivering portions of the crushed metallizing agent to the crucible 6 (46). The metallizing agent is added outside the evaporation zone which, in case of a smooth movement and heating of the crucible 6 (46), with a fresh portion of the metallizing agent 7 charged into it, makes it possible to gradually remove gases from the metallizing agent before it begins to evaporate.

The charging facility 9, 49 comprises the airtight seals, which enables the delivery of the metallizing agent without violating the vacuum in the metallization chamber.

Testing of the apparatus for vacuum coating of the metal band was carried out on an operating model; crushed ferrochrome (70% by weight of chrome and the rest iron) of fraction from 1 to 5 mm was used as a metallizing agent. The coating was applied on a steel band 0.5 to 2 mm thick. The experiments have shown that the coils of the band to be treated are easily replaced in the vacuum-coating apparatus; when the band is fed into the metallization chamber the coating is carried out continuously and no time is wasted on replacing the coils. While new portions of the ferrochrome metallizing agent are added into the crucible, the emission of gases does not exceed a permissible value.

Continuous operation of the evaporator is ensured. A diffusion layer of ferrochrome up to 100 microns thick was obtained on the steel band which, with the mentioned coating, has good ductible properties (it can be subjected to stamping) and withstands a temperature of up to 800° C in the atmosphere.

What we claim is:

1. An apparatus for vacuum coating of a substrate in the form of a metal band, including alternating operational phases of setting up the coating operation comprising:
   an evaporative metallization chamber;
   evaporator means and means to feed said evaporator means with coating material disposed in chamber;
   means to separately evacuate each and all of said chambers;
   a winding chamber arranged transversely to said metallization chamber at each end thereof;
   substrate supply and windup rolls in each of said winding chambers;
   reciprocating carriage means disposed in said metallization chamber and operatively associated with guides defining a path between winding chambers;
   a tension roller disposed on each end of said carriage means;
   a plurality of guide rolls disposed in each said winding chambers for guiding a substrate in movement from and to said supply and windup rolls;
   means for reciprocating said carriage means whereby at each extreme position of reciprocation one said tension roller is disposed in one of said winding chambers associated with said extreme position and the other said tension roller is disposed in and at the end of the metallization chamber remote from the other of said winding chambers;
   lock means operable to secure the carriage means at each of said extreme positions;
   gate means selectively operable to seal off the winding chamber having the tension roller disposed therein and commuicating the other winding chamber with the metallization chamber; and
   means in cooperation with the guide rolls in the non-sealed chamber and the tension roller in the metallization chamber to effect said substrate movement, whereby the substrate leads off the supply roll, traverses the evaporator means to receive said coating, passes around said tension roller in the metallization chamber and is received on the windup roll;
   while simultaneously with such coating application the sealed off winding chamber may be loaded or unloaded.

2. The apparatus as defined in claim 1, wherein said gate means is provided at a central portion of said carriage means and said lock means comprises an elongated element extending from each end of the carriage means and an arrester means disposed in each winding chamber and co-acting with the associated elongated element when the carriage means is at the related extreme position of reciprocation.

3. The apparatus as defined in claim 1, wherein said metallization chamber includes two of said feed means for charging the coating material into a crucible of said evaporator means, which feed means are arranged at both sides of an evaporation zone of the coating material, at a distance not exceeding the length of said crucible, the latter being mounted on a bogie that can be moved alternately and reciprocating to each of said reed means in additional guides also arranged along said metallization chamber.

4. The apparatus as defined in claim 1, wherein said carriage means comprise a pair of separable serially arranged carriage members; each of said carriage members having a said tension roller at the outer end thereof; said lock means being disposed within said metallization chamber; and said gate means comprising a separate valve element disposed intermediate each winding chamber and the related end of the metallization chamber; whereby at each said extreme position of the carriage means, the lead carriage member only is disposed in the related winding chamber, while the lock means is operative on the other carriage member.

* * * * *